(12) United States Patent
Ohnishi et al.

(10) Patent No.: US 7,105,265 B2
(45) Date of Patent: Sep. 12, 2006

(54) METHOD FOR REMOVING RESIST PATTERN

(75) Inventors: Hiroyuki Ohnishi, Kawasaki (JP); Kazuhiko Nakayama, Kawasaki (JP); Isamu Takagi, Kawasaki (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 85 days.

(21) Appl. No.: 11/007,037

(22) Filed: Dec. 8, 2004

(65) Prior Publication Data

US 2005/0130055 A1    Jun. 16, 2005

(30) Foreign Application Priority Data

Dec. 12, 2003 (JP) .............................. 2003-415126

(51) Int. Cl.
*G03F 7/42* (2006.01)

(52) U.S. Cl. ........................................ 430/256; 430/260

(58) Field of Classification Search ................ 430/256, 430/260

See application file for complete search history.

(56) References Cited

U.S. PATENT DOCUMENTS

| | | | | |
|---|---|---|---|---|
| 6,072,006 A | * | 6/2000 | Bantu et al. ................ | 525/262 |
| 2003/0130149 A1 | * | 7/2003 | Zhou et al. ................ | 510/176 |
| 2004/0018446 A1 | * | 1/2004 | Aoki et al. ............... | 430/271.1 |

FOREIGN PATENT DOCUMENTS

| JP | 58-194834 | 11/1983 |
|---|---|---|
| JP | 64-042653 | 2/1989 |
| JP | 06-230574 | 8/1994 |
| JP | 06-289614 | 10/1994 |
| JP | 07-134412 | 5/1995 |
| JP | 08-190205 | 7/1996 |
| JP | 08-202051 | 8/1996 |
| JP | 08-262746 | 10/1996 |
| JP | 09-006001 | 1/1997 |
| JP | 09-054442 | 2/1997 |
| JP | 09-096911 | 4/1997 |
| JP | 09-152721 | 6/1997 |
| JP | 2000-047400 | 2/2000 |
| JP | 2000-292927 | 10/2000 |
| JP | 2002-529552 | 9/2002 |

* cited by examiner

*Primary Examiner*—Hoa Van Le
(74) *Attorney, Agent, or Firm*—Knobbe Martens Olson & Bear LLP

(57) ABSTRACT

A method for removing a resist pattern having a resist pattern forming step of forming a resist pattern on a substrate using a chemically amplified positive resist composition and a removing step of removing the resist pattern from the substrate using a solvent, a composition prepared by dissolving (A) an alkali soluble resin having a hydroxyl group in the side chain, (B) a photo acid generator and (C) a compound represented by the following general formula (I):

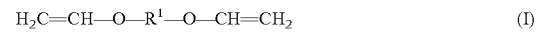

$$H_2C=CH-O-R^1-O-CH=CH_2 \qquad (I)$$

wherein $R^1$ represents an alkylene group having 1 to 10 carbon atoms or the like, in an organic solvent being used as the chemically amplified positive resist composition, the method further having a heat treatment step of heat-treating the substrate on which the resist pattern is formed at a temperature of 150 to 400° C. between the resist pattern forming step and the removing step.

9 Claims, No Drawings

METHOD FOR REMOVING RESIST PATTERN

BACKGROUND OF THE INVENTION

1. Field of the Invention

The present invention relates to a method for removing a chemically amplified positive photoresist composition.

This application claims priority from Japanese Patent Application No. 2003-415126 filed on Dec. 12, 2003, the disclosure of which is incorporated by reference herein.

2. Background Art (1) As disclosed in Japanese Patent Application, First Publication No. Hei 6-148889, Japanese Patent Application, First Publication No. Hei 6-230574, Published Japanese Translation No. 2002-529552 of the PCT Application and Japanese Patent Application and First Publication No. 2000-292927, various positive photoresist compositions have hitherto been proposed and put into practical use.

(2) As means for improving the heat resistance of a resist pattern, a method of subjecting to a heat treatment referred to as postbaking of ultraviolet-curing a resist pattern has been proposed.

(3) A trial of forming a resist pattern having high heat resistance includes the use of a negative photoresist composition.

(4) Various positive photoresist compositions having high heat resistance have been reported.

For example, a composition comprising an alkali soluble resin such as polyhydroxystyrenic resin or novolak resin, a compound having a vinyl bond at both ends and a photo acid generator is cheaper than a conventional i-ray novolak-based resist and is also a resist having high heat resistance, high sensitivity and high resolution.

(5) There has been known a composition comprising a reaction product of an alkali soluble resin such as polyhydroxystyrenic resin or novolak resin and a compound represented by the following general formula (I), and a photo acid generator.

However, in the case of (1), the positive photoresist composition is inferior in heat resistance of the unexposed area (resist pattern) and it was difficult to apply to fields which require high heat resistance.

In the case of (2), the resist pattern modified by the heat treatment has high heat resistance. However, it becomes difficult to remove a resist pattern in the case of a treatment with a remover containing a conventional organic solvent and thus the resist pattern must be removed under very severe conditions by an ashing treatment.

In the case of (3), the negative photoresist composition is inferior in sensitivity and resolution as compared with the positive photoresist composition and it is required to perform an ashing treatment so as to remove a resist pattern, and thus causing problems such as complicated work-in-process, high production cost and high load on a substrate.

In the case of (4) and (5), although a resist pattern having very high heat resistance can be formed, the resist pattern must be removed under very severe conditions similar to case of (2) and (3).

Therefore, there has been required to develop a method which can form a resist pattern having excellent heat resistance regardless of the use of a positive photoresist composition having excellent resist characteristics and also can remove the resist pattern having excellent heat resistance in a simple manner.

SUMMARY OF THE INVENTION

Thus, an object of the present invention is to provide a technique capable of removing a chemically amplified positive resist composition having heat resistance.

The present inventors have intensively researched and found that the above object can be achieved by the following solution means, and thus the present invention has been completed.

The first aspect of the present invention is directed to a method for removing a resist pattern, which comprises the resist pattern forming step of forming a resist pattern on a substrate using a chemically amplified positive resist composition and the removing step of removing the resist pattern from the substrate using a solvent, a composition prepared by dissolving (A) an alkali soluble resin having a hydroxyl group in the side chain, (B) a photo acid generator and (C) a compound represented by the following general formula (I):

$$H_2C=O-R^1-O-CH=CH_2- \quad (I)$$

wherein $R^1$ represents either an alkylene group having 1 to 10 carbon atoms which may have a substituent, or a group represented by the following general formula (II):

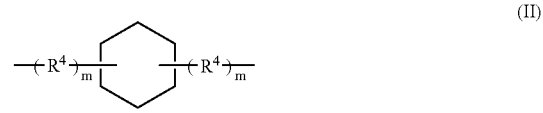

(wherein $R^4$ represents an alkylene group having 1 to 10 carbon atoms which may have a substituent, and m represents 0 or 1) in an organic solvent being used as the chemically amplified positive resist composition, said method further comprising the heat treatment step of heat-treating the substrate on which the resist pattern is formed at a temperature of 150 to 400° C. between the resist pattern forming step and the removing step.

The second aspect of the present invention is directed to a method for removing a resist pattern, which comprises the resist pattern forming step of forming a resist pattern on a substrate using a chemically amplified positive resist composition and the removing step of removing the resist pattern from the substrate using a solvent, a composition prepared by dissolving (a) a reaction product of the component (A) and the component (C), and (B) a photo acid generator in an organic solvent being used as the chemically amplified positive resist composition, said method further comprising the heat treatment step of heat-treating the substrate on which the resist pattern is formed at a temperature of 150 to 400° C. between the resist pattern forming step and the removing step.

As a value of a weight average molecular weight (Mw) of a photoresist composition in the present specification, a value measured by the following GPC system is used.

Apparatus: SYSTEM 11 (trade name, manufactured by Showa Denko K. K.); Precolumn: KF-G (trade name, manufactured by Shodex); column: KF-805, KF-803, KF-802 (trade name, manufactured by Shodex); detector: UV41 (trade name, manufactured by Shodex), measured at 280 nm Solvent: tetrahydrofuran at a flow rate of 1.0 ml/min, measured at 35° C.

Method for preparation of sample: A sample having a solid content of 0.1% by weight is prepared by adjusting the solid content of a photoresist composition to be measured to 30% by weight, followed by dilution with tetrahydrofuran. 20 microliters of the sample was charged in the above apparatus and the measurement is performed.

In the present specification and claims, a constituent unit means a monomer unit constituting a polymer (resin).

Also a hydroxystyrenic resin has a hydroxystyrenic constituent unit.

The hydroxystyrenic constituent unit is a constituent unit derived from hydroxystyrene and a hydroxystyrene derivative.

According to the present invention, there can be provided a technique capable of removing a chemically amplified positive resist composition having heat resistance.

DETAILED DESCRIPTION OF THE INVENTION

A preferred embodiment (mode) of the present invention will now be described.

Method for Removing Resist Pattern

The present invention is characterized in that a heat treatment step is performed between the resist pattern forming step and the removing step of removing a resist pattern using a chemically amplified positive resist composition having specific excellent heat resistance.

An example of the present invention will now be described.

First, a chemical amplification positive resist composition is applied onto a substrate using a spinner to form a coating film. As the substrate, a silicon substrate or a glass substrate can be used.

Then, the substrate on which the coating film is formed is subjected to a heat treatment (prebake) at a temperature of 90 to 140° C. to remove a residual solvent, and thus a resist film is formed. When using a glass substrate as the substrate, it is preferred to perform proximity baking wherein a space is left between a hot plate and a substrate.

Then, the resist film is subjected to selective exposure via a predetermined mask.

A light source used herein is not specifically limited, and it is preferred to use i-ray (365 nm) or light having a shorter wavelength, for example, an electron beam or X-ray beam so as to form a fine pattern.

After the selective exposure, the resist film is subjected to a heat treatment (post-exposure bake: PEB). Consequently, an acid component generated from the component (B) can be diffused. The PEB method includes a proximity baking wherein a gap is left between a hot plate and a substrate, and a direct baking method wherein no gap is left. When using a glass substrate as the substrate, a method of performing direct baking after performing proximity baking is preferably used so as to obtain the diffusion effect due to PEB without causing warp of the substrate. Wrap of the substrate may cause serious problems when used for an LCD. The heating temperature is preferably from 90 to 150° C., and particularly preferably from 100 to 140° C.

After PEB, when the resist film is subjected to a development treatment with a developer, for example, an aqueous alkali solution such as aqueous 1–10 wt % tetramethylammonium hydroxide solution, the exposed area is dissolved and removed to form a resist pattern.

Then, the developer which remained on the surface of the resist pattern is washed off with a rinsing solution such as pure water.

The resulting resist pattern is employed in etching using the same as a mask, or used as a mask for a lift-off method. With respect to etching, wet etching or dry etching is applied.

Then, unnecessary resist pattern is removed. In the present invention, a heat treatment is performed at 150° C. or higher, preferably from 150 to 400° C., and more preferably from 180 to 250° C. When heated to 150° C. or higher, the resist pattern is removed with ease in the subsequent removing step. When heated to 400° C. or lower, there may not arise a problem such as thermal deterioration of the substrate and other elements.

The time of the heat treatment is set to 60 seconds or more, preferably from 60 to 600 seconds, and more preferably from 150 to 300 seconds. When the time is set to 60 seconds or more, the effect of easy removability is improved. On the other hand, when the time is set to 600 seconds or less, the likelihood of lowered throughput decreases, and thus it is preferable from an industrial point of view.

Then, a resist pattern (chemically amplified positive resist composition) is removed with a solvent. A remover containing a solvent is commonly used.

The remover can be used without any limitation as long as it is a remover for resist. The remover is roughly classified into an inorganic remover which removes a resist by oxidizing the resist, and an organic remover which removes a resist by swelling the resist.

Various removers for resist have been proposed.

Examples thereof include a resist remover composition comprising alkanolamines, alkoxyalkylamines or alkoxyalkanolamines, a glycol monoalkyl ether, saccharides or sugar alcohols, and water (see Japanese Patent Application, First Publication No. Hei 8-190205); a resist remover composition comprising alkanolamines, alkoxyalkylamines or alkoxyalkanolamines, acid amides, saccharides or sugar alcohols, and water (see Japanese Patent Application, First Publication No. Hei 8-202051); a resist remover composition comprising alkanolamines, alkoxyalkylamines or alkoxyalkanolamines, glycol monoalkyl ether, saccharides or sugar alcohols, a quaternary ammonium hydroxide, and water (see Japanese Patent Application, First Publication No. Hei 8-262746), a resist remover composition comprising alkanolamines, alkoxyamines or alkoxyalkanolamines, hydroxylamines, saccharides or sugar alcohols, a surfactant, and water (see Japanese Patent Application, First Publication No. Hei 9-54442), a resist remover composition comprising alkanolamines, a diethylene glycol monoalkyl ether, saccharides or sugar alcohols, N,N-diethylhydroxylamine, and water (see Japanese Patent Application, First Publication No. Hei 9-152721) and a resist remover composition comprising amines having pKa of 7.5 to 13, hydroxylamines, a water soluble organic solvent, an anticorrosive, and water (see Japanese Patent Application, First Publication No. Hei 9-96911).

Also there have been proposed a resist remover composition comprising at least one selected from among (a) alkanolamines, (b) N,N-diethylhydroxylamine, (c) saccharides and (d) N-methyl-2-pyrrolidone or N,N-dimethyl sulfoxide, and (e) water (see Japanese Patent Application, First Publication No. 2000-47400); and positive photoresist remover comprising a composition containing (A) dimethyl sulfoxide as a main component, at least one solvent selected from among (B) diethylene glycol monoalkyl ether, diethylene glycol dialkyl ether, γ-butyrolactone and 1,3-dimethyl-2-imidazolidinone, and (C) a nitrogen-containing organic hydroxyl compound, the content of the component (B) being within a range from 10 to 30% by weight, the content of the component (C) being within a range from 0.5 to 3% by weight, based on the total amount of the composition (see Japanese Patent No. 2578821).

As the remover, a remover made of at least one solvent selected from among PGME (propylene glycol monomethyl ether), PGMEA (propylene glycol monomethyl ether acetate), γ-butyrolactone, methyl ethyl ketone, butyl acetate, DMSO (dimethyl sulfoxide) and monoethanolamine is preferred because it is suited for removal of the positive photoresist composition used in the present invention.

These solvents are used as the remover as they are, but may appropriately contain additives for improving the removability, if necessary.

These removers are commercially available and examples thereof include OK73 Thinner (trade name, manufactured by Tokyo Ohka Kogyo Co., Ltd.) and Hakuri 106 (trade name, manufactured by Tokyo Ohka Kogyo Co., Ltd.).

The removing method and conditions are not specifically limited and, for example, a dipping method and a shower method can be used.

Specifically, the substrate on which the resist pattern is formed is dipped in a remover set at about 25 to 40° C. and maintained for about 60 to 300 seconds.

The chemically amplified positive photoresist composition used in the method of the present invention will now be described in detail.

First Embodiment

In the first embodiment, a composition prepared by dissolving the component (A), the component (B) and the component (C) in an organic solvent is used.

Component (A)

The component (A) is not specifically limited and can be optionally selected from among those which are commonly used as a film forming material in a positive photoresist composition. Preferably, a novolak resin obtained by the condensation reaction of an aromatic hydroxy compound and aldehydes or ketones, polyhydroxystyrene and a derivative thereof (hydroxystyrenic resin) can be listed.

Examples of the aromatic hydroxy compound include phenol; cresols such as m-cresol, p-cresol and o-cresol; xylenols such as 2,3-xylenol, 2,5-xylenol, 3,5-xylenol and 3,4-xylenol; alkenylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol and 2-tert-butyl-5-methylphenol; alkoxyphenols such as p-methoxyphenol, m-methoxyphenol, p-ethoxyphenol, m-ethoxyphenol, p-propoxyphenol and m-propoxyphenol; isopropenylphenols such as o-isopropenylphenol, p-isopropenylphenol, 2-methyl-4-isopropenylphenol and 2-ethyl-4-isopropenylphenol; arylphenols such as phenylphenol; and polyhydroxyphenols such as 4,4'-dihydroxybiphenyl, bisphenol A, resorcinol, hydroquinone and pyrogallol. These compounds may be used alone or in combination.

Examples of the aldehydes include formaldehyde, paraformaldehyde, trioxane, acetaldehyde, propionaldehyde, butylaldehyde, trimethylacetaldehyde, acrolein, crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde and cinnamic acid aldehyde. These aldehydes may be used alone or in combination.

Among these aldehydes, formaldehyde is preferable in view of availability. It is particularly preferred to use hydroxybenzaldehydes and formaldehyde in combination so as to improve the heat resistance.

Examples of the ketones include acetone, methyl ethyl ketone, diethyl ketone and diphenyl ketone. These ketones may be used alone or in combination. Furthermore, aldehydes and ketones may be appropriately used in combination.

The condensation reaction product of the aromatic hydroxy compound and aldehydes or ketones can be prepared by a known method in the presence of an acidic catalyst. As the acidic catalyst, for example, hydrochloric acid, sulfuric acid, formic acid, oxalic acid and paratoluenesulfonic acid can be used.

Examples of the polyhydroxystyrene and derivative thereof (hydroxystyrenic resin) include a homopolymer of vinylphenol, and a copolymer of vinylphenol and a comonomer which is copolymerizable with the vinylphenol. Examples of the comonomer include acrylic acid derivative, acrylonitrile, methacrylic acid derivative, methacrylonitrile, and styrene derivative such as styrene, α-methylstyrene, p-methylstyrene, o-methylstyrene, p-methoxystyrene or p-chlorostyrene.

Among these, preferable resins are novolak resin, polyhydroxystyrene and hydroxystyrene-styrene copolymer.

When using a novolak resin as the component (A), the weight average molecular weight Mw is within a range from 1000 to 50000, and preferably from about 1000 to 20000, in view of sensitivity behavior. Mw is more preferably within a range from 2000 to 15000. When Mw is less than the above range, the resolution may deteriorate. On the other hand, when Mw is more than the above range, the coatability deteriorate.

When using a novolak resin as the component (A), it is preferred to use it in combination with the component (D) and a storage stabilizer described hereinafter in view of long-term storage stability of the resist composition.

When using a hydroxystyrenic resin as the component (A), the content of a hydroxystyrenic constituent unit is at least 50 to 99 mol %, and preferably from 70 to 90 mol %, in view of the reactivity with the component (C).

The hydroxystyrenic resin is a resin which scarcely exhibits acidity as compared with the novolak resin. Since the degree of acidity of the component (A) exerts an influence on the storage stability of the resist composition, a hydroxystyrenic resin is preferably selected for the purpose of preparing a resist composition having good storage stability. Among these hydroxystyrenic resins, a hydroxystyrenic resin having a styrene constituent unit derived from the above styrene and styrene derivative and an alkyl-substituted styrene constituent unit (hereinafter, both are referred to as a "styrenic constituent unit") is preferred because it has the effect of improving the sensitivity and heat resistance of the resist composition, and shape of the resist pattern.

The content of the styrenic constituent unit is preferably from 1 to 30 mol %, and more preferably from 5 to 15 mol %, in view of security of the reactivity with the component (C), an improvement in heat resistance, and an improvement in sensitivity.

When using a hydroxystyrenic resin as the component (A), Mw is preferably from 1000 to 40000, more preferably from 1000 to 8000, and particularly preferably from 2000 to 6000, in view of heat resistance, higher sensitivity, and stability with a crosslinking agent.

As the component (A), one or more kinds of materials can be used alone or in combination.

Component (B)

The component (B) is not specifically limited and there can be used photo acid generators which have hitherto been known as materials of a chemically amplified positive photoresist composition, for example, sulfonyldiazomethane acid generators, onium salt acid generators and oxime sulfonate acid generator.

As exposure light, for example, there can be used ultraviolet light in which g-rays, h-rays and i-rays coexist, short-wavelength g-rays, short-wavelength i-rays, light having a wavelength shorter than that of i-rays, electron beam and X-rays. The component (B) is preferably a compound which exhibits high acid generation efficiency when exposed to ultraviolet rays. Since i-ray is exposure light which is used most popularly, a compound is preferred which exhibits high acid generation efficiency to i-ray exposure.

As the component (B), for example, the following compound is preferably used because of high acid generation efficiency to i-ray exposure.

Compounds represented by the following general formulas (V) and (VI):

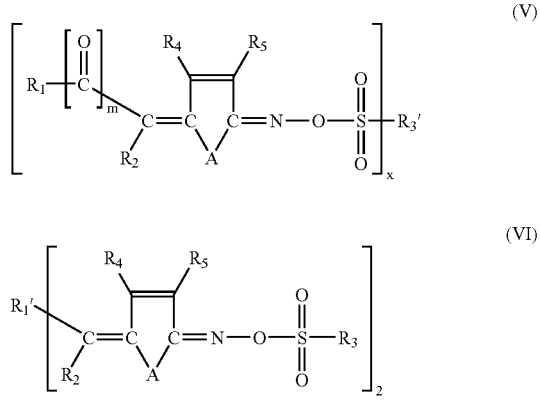

wherein m' represents 0 or 1; X represents 1 or 2; $R_1$ represents a phenyl or heteroaryl group which may be substituted with one or more $C_1$–$C_{12}$ alkyl groups, or a $C_2$–$C_6$ alkoxycarbonyl group, a phenoxycarbonyl group or CN when m' is 0; $R_1'$ represents a $C_2$–$C_{12}$ alkylene group; $R_2$ has the same meaning as that of $R_1$; $R_3$ represents a $C_1$–$C_{18}$ alkyl group; $R_3'$ has the same meaning as that of $R_3$ when X=1, or represents a $C_2$–$C_{12}$ alkylene group or a phenylene group when X=2; $R_4$ and $R_5$ independently represent a hydrogen atom, halogen or a $C_1$–$C_6$ alkyl group; A represents S, O or $NR_6$; and $R_6$ represents a hydrogen atom or a phenyl group (U.S. Pat. No. 6,004,724). Specific examples thereof include thiolene-containing oxime sulfonate represented by the following formula (VII).

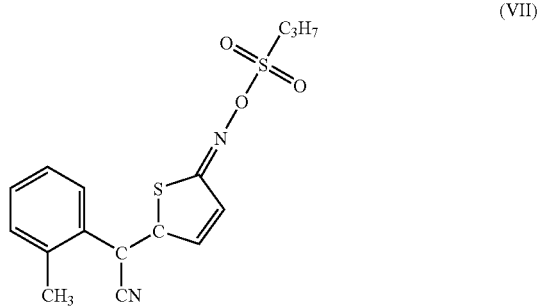

Also there can be exemplified a bis(trichloromethyl) triazine compound represented by the following formula (VIII):

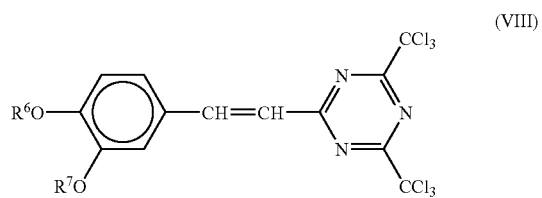

wherein $R^6$ and $R^7$ each represents an alkyl group having 1 to 3 carbon atoms, or a combination of the compound (VIII) and a bis(trichloromethyl)triazine compound represented by the following formula (IX):

wherein Z represents a 4-alkoxyphenyl group (see Japanese Patent Application, First Publication No. Hei 6-289614, Japanese Patent Application and First Publication No. Hei 7-134412).

Specific examples of the triazine compound (VIII) include 2-[2-(3,4-dimethoxyphenyl)ethenyl]-4,6-bis(trichloromethyl)-1,3,5-triazine, 2-[2-(3-methoxy-4-ethoxyphenyl)ethenyl]-4,6-bis(trichloromethyl)-1,3,5-triazine, 2-[2-(3-methoxy-4-propoxyphenyl)ethenyl]-4,6-bis(trichloromethyl)-1,3,5-triazine, 2-[2-(3-ethoxy-4-methoxyphenyl)ethenyl]-4,6-bis(trichloromethyl)-1,3,5-triazine, 2-[2-(3,4-diethoxyphenyl)ethenyl]-4,6-bis(trichloromethyl)-1,3,5-triazine, 2-[2-(3-ethoxy-4-propoxyphenyl)ethenyl]-4,6-bis(trichloromethyl)-1,3,5-triazine, 2-[2-(3-propoxy-4-methoxyphenyl)ethenyl]-4,6-bis(trichloromethyl)-1,3,5-triazine, 2-[2-(3-propoxy-4-ethoxyphenyl)ethenyl]-4,6-bis(trichloromethyl)-1,3,5-triazine and 2-[2-(3,4-dipropoxyphenyl)ethenyl]-4,6-bis(trichloromethyl)-1,3,5-triazine. These triazine compounds may be used alone or in combination.

Examples of the triazine compound (IX), which is optionally used in combination with the triazine compound (VIII), include 2-(4-methoxyphenyl)-4,6-bis(trichloromethyl)-1,3,5-triazine, 2-(4-ethoxyphenyl)-4,6-bis(trichloromethyl)-1,3,5-triazine, 2-(4-propoxyphenyl)-4,6-bis(trichloromethyl)-1,3,5-triazine, 2-(4-butoxyphenyl)-4,6-bis(trichloromethyl)-1,3,5-triazine, 2-(4-methoxynaphthyl)-4,6-bis(trichloromethyl)-1,3,5-triazine, 2-(4-ethoxynaphthyl)-4,6-bis(trichloromethyl)-1,3,5-triazine, 2-(4-propoxynaphthyl)-4,6-bis(trichloromethyl)-1,3,5-triazine, 2-(4-butoxynaphthyl)-4,6-bis(trichloromethyl)-1,3,5-triazine, 2-(4-methoxy-6-carboxynaphthyl)-4,6-bis(trichloromethyl)-1,3,5-triazine, 2-(4-methoxy-6-hydroxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(5-ethyl-2-furyl)ethenyl]-4,6-bis(trichloromethyl)-1,3,5-triazine, 2-[2-(5-propyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3-methoxy-5-ethoxyphenyl)ethenyl]-4,6-bis (trichloromethyl)-1,3,5-triazine, 2-[2-(3-methoxy-5-propoxyphenyl)ethenyl]-4,6-bis(trichloromethyl)-1,3,5-triazine, 2-[2-(3-ethoxy-5-methoxyphenyl)ethenyl]-4,6-bis(trichloromethyl)-1,3,5-triazine, 2-[2-(3,5-diethoxyphenyl)ethenyl]-4,6-bis(trichloromethyl)-1,3,5-triazine, 2-[2-(3-ethoxy-5-propoxyphenyl)ethenyl]-4,6-bis(trichloromethyl)-1,3,5-triazine, 2-[2-(3-propoxy-5-methoxyphenyl)ethenyl]-4,6-bis(trichloromethyl)-1,3,5-triazine, 2-[2-(3-propoxy-5-ethoxyphenyl)ethenyl]-4,6-bis(trichloromethyl)-1,3,5-triazine, 2-2-(3,5-dipropoxyphenyl)ethenyl]-4,6-bis(trichloromethyl)-1,3,5-triazine, 2-(3,4-methylenedioxyphenyl)-4,6-bis(trichloromethyl)-1,3,5-triazine and 2-[2-(3,4-methylenedioxyphenyl)ethenyl]-4,6-bis(trichloromethyl)-1,3,5-triazine. These triazine compounds may be used alone or in combination.

Also there is exemplified a compound represented by the following formula (X):

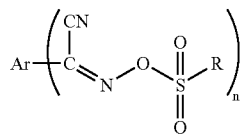

(X)

wherein Ar represents a substituted or unsubstituted phenyl or naphthyl group; R represents a $C_1$ to $C_9$ alkyl group; and n represents an integer of 2 or 3. These compounds may be used alone or in combination. Among the compounds described above, the compound represented by the formula (VII) and the compound represented by the formula (XI) are preferably used because of excellent acid generation efficiency to i-ray.

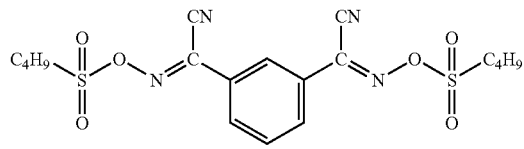

(XI)

In this embodiment, one or more kinds of the components (B) can be used alone or in combination.

The amount of the component (B) is from 1 to 30 parts by weight, and preferably from 1 to 20 parts by weight, based on 100 parts by weight of the component (A).

Component (C)

The component (C) is a compound represented by the general formula (I) and serves as a crosslinking agent.

When a resist material containing the components (A) to (C) is applied on a substrate and then heated, a hydroxyl group (preferably a phenolic hydroxyl group in the side chain) of the component (A) may be reacted with a terminal vinyl group of the component (C) as a constituent unit to form a crosslinked structure. It is presumed that the resist film becomes slightly soluble in an aqueous alkali solution such as alkali developer used to form a resist pattern.

It is presumed that, when the resin component having the crosslinked structure is reacted with an acid generated from the component (B) under exposure, the crosslinked structure is cleaved and the solubility of the resin component in the aqueous alkali solution increases.

It is presumed that a resist pattern having high heat resistance can be obtained by the action of the crosslinked structure.

In the general formula (I), $R^1$ is a branched or linear alkylene group having 1 to 10 carbon atoms which may have a substituent, or a group represented by the general formula (II). The alkylene group may have an oxygen bond (ether bond) in the main chain. In the general formula (II), $R^4$ may also be a branched or linear alkylene group having 1 to 10 carbon atoms which may have a substituent. The alkylene group may have an oxygen bond (ether bond) in the main chain. $R^1$ is preferably —$C_4H_8$—, —$C_2H_4OC_2H_4$—, —$C_2H_4OC_2H_4OC_2H_4$—, or a group represented by the general formula (II), more preferably a group represented by the general formula (II), and particularly preferably a group wherein $R^4$ has one carbon atom and m is 1.

These components (C) can be used alone or in combination.

When using a novolak resin as the component (A), the component (C) is preferably used in a proportion within a range from 1 to 50% by weight, and more preferably from 5 to 35% by weight, based on the component (A). When the proportion is less than 1% by weight, thickness loss of the unexposed area of the resist pattern increases and thus contrast of the resist pattern tends to deteriorate. On the other hand, when the proportion is more than 50% by weight, the solubility in a developer (aqueous alkali solution) tends to drastically deteriorate, thus causing problems such as poor sensitivity and failure in resolution.

When a hydroxystyrenic resin is selected as the component (A), the component (C) is preferably used in the proportion within a range from 1 to 50% by weight, and more preferably from 5 to 40% by weight, based on the component (A).

Component (D)

A chemically amplified positive photoresist composition preferably contains a basic compound (preferably amines) as the component (D) so as to enhance post-exposure stability of the latent image formed by the pattern-wise exposure of the resist layer.

The compound may be any compound having compatibility with a photoresist composition and includes, but is not limited to, a compound described in Japanese Patent Application, First Publication No. Hei 9-6001.

The addition of a comparatively bulky and specific basic compound (d1) represented by the following general formula (III) suppresses the amount of an acid component produced, as by-product, with time in the resist composition, and also improves the long-term storage stability of the resist composition.

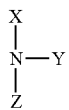

(III)

In the general formula (III), at least one (preferably 2 or more, most preferably 3) among X, Y and Z is a group selected from the following (1) to (4), for example, (1) an alkyl group having 4 or more carbon atoms, (2) a cycloalkyl group having 3 or more carbon atoms, (3) a phenyl group, (4) an aralkyl group.

Among X, Y and Z, those other than the above (1) to (4) are groups or atoms selected from (1') an alkyl group having 3 or less carbon atoms and (2') a hydrogen atom.

X, Y and Z may be the same or different. When at least two groups among X, Y and Z are groups selected from the above (1) to (4), these groups are preferably the same in view of stability of the effect.

(1) Alkyl Group Having 4 or More Carbon Atoms

In the case of (1), it is difficult to improve the storage stability as a resist solution when the number of carbon atoms is less than 4. The number of carbon atoms is more preferably 5 or more, and particularly preferably 8 or more. The upper limit is not specifically limited, but is preferably 20 or less, and particularly preferably 15 or less in view of the effect of the storage stability as a resist solution and availability. When the number of carbon atoms is more than 20, basicity becomes weak and thus the effect of storage stability as a resist solution deteriorates.

The alkyl group may be linear or branched.

Specifically, n-decyl group, n-octyl group and n-pentyl group are preferable.

(2) Cycloalkyl Group Having 3 or More Carbon Atoms

Among these cycloalkyl groups, a cycloalkyl group having 4 to 8 carbon atoms is preferable in view of availability and excellent effect of improving the storage stability as a resist solution. A cyclohexyl group having 6 carbon atoms is particularly preferable.

(4) Aralkyl Group

The aralkyl group is represented by the general formula: —R'—P(R' represents an alkylene group and P represents an aromatic hydrocarbon group).

P includes a phenyl group and a naphthyl group, and a phenyl group is preferable.

The number of carbon atoms of R' may be 1 or more, and is preferably from 1 to 3.

The aralkyl group is preferably a benzyl group or a phenylethyl group.

Among X, Y and Z, those other than the above (1) to (4) are groups or atoms selected from the above (1') and (2').

(1') may be linear or branched. A methyl group and an ethyl group are particularly preferable.

The basic compound (d1) preferably constitutes a tertiary amine. Among X, Y and Z, those other than the above (1) to (4) are selected from (1').

Specific examples of the basic compound (d1) include tri-n-decylamine, methyl-di-n-octylamine, tri-n-pentylamine, N,N-dicyclohexylmethylamine and tribenzylamine.

Among these compounds, at least one selected from tri-n-decylamine, methyl-di-n-octylamine and tri-n-pentylamine is preferable and tri-n-decylamine is particularly preferable.

These components (D) can be used alone or in combination.

The content of the component (D) is preferably from 0.01 to 5.0 parts by weight, and particularly preferably from 0.1 to 1.0 parts by weight, based on 100 parts by weight of the solid content of the resin in view of the effect.

Organic Solvent

The organic solvent can be used without any limitation as long as it can be used in a chemically amplified positive photoresist composition.

Examples thereof include ester solvents such as propylene glycol monoalkyl ether acetate (for example, propylene glycol monomethyl ether acetate (PGMEA), etc.) and lactate ester (for example, ethyl lactate, etc.); and non-ester solvents, for example, ketones such as acetone, methyl ethyl ketone, cyclohexanone, methyl isoamyl ketone and 2-heptanone; polyhydric alcohols and derivatives, such as ethylene glycol, propylene glycol, diethylene glycol, or monomethyl ethers thereof, monoethyl ether, monopropyl ether, and monobutyl ether or monophenyl ether; and cyclic ethers such as dioxane. Since ester solvents are reaction products of organic carboxylic acids and alcohols, they contain an organic carboxylic acid as a free acid. Therefore, non-ester solvents containing no free acid are preferably selected in the case of a resist composition containing no component (D) or a resist composition containing no storage stabilizer described hereinafter, and ketones (ketone solvents) are particularly preferable. Among these, 2-heptanone is preferable in view of the coatability and solubility of the component (B).

Both ester solvents and non-ester solvents may decompose over time to produce an acid as a by-product. In the presence of the component (D) or the storage stabilizer described hereinafter, the decomposition reaction is suppressed. In the case of ester solvents, a remarkable effect is exerted. In the presence of the component (D) and the storage stabilizer, ester solvents are preferable and PGMEA is particularly preferable.

It has been confirmed that formic acid, acetic acid or propionic acid is produced as the acid component produced, as a by-product, by the decomposition, in the case of 2-heptanone.

These organic solvents can be used alone or in combination.

If necessary, the following storage stabilizers may be added to the composition of this embodiment.

The storage stabilizer is not specifically limited as long as it has an action of suppressing the decomposition reaction of the solvent and examples thereof include antioxidants described in Japanese Patent Application, First Publication No. Sho 58-194834. As the antioxidant, phenolic compounds and amine compounds are known. Among these compounds, phenolic compounds are preferable and 2,6-di (tert-butyl)-p-cresol and derivatives thereof are particularly effective to prevent deterioration of ester solvents and ketone solvents and are also excellent in view of availability, low cost and excellent storage stabilization effect. They are particularly excellent in deterioration preventing effect to propylene glycol monoalkyl ether acetate and 2-heptanone.

The amount is preferably from 0.01 to 3 parts by weight, and particularly preferably from 0.1 to 1.0 parts by weight, based on 100 parts by weight of the solid content of the resin.

As long as the object of the present invention is not adversely affected, conventional additives having compatibility, for example, additive resins, plasticizers, stabilizers and surfactants for improving performances of the coating film of the photosensitive composition, colorants to further visualize the developed images, sensitizers for improving the sensitization effect, antihalation dyes, and adhesion modifies can be added to the composition of this embodiment.

Method for Preparation of Positive Photoresist Composition

The positive photoresist composition used in this embodiment is preferably prepared by mixing the components (A) to (C) and, if necessary, other components so as to adjust a polystyrene equivalent weight average molecular weight (Mw) determined using gel permeation chromatography of the solid content contained in the photoresist composition within a range from 3000 to 100000, preferably from 4000 to 30000, and dissolving the mixture in an organic solvent.

Since the positive photoresist composition of this embodiment exhibits a chemically amplified mechanism, development contrast between the unexposed area and the exposed area is strong and thus good resolution and DOF (Depth of Focus) characteristics can be obtained within a preferred range of Mw.

By adjusting Mw of the solid content of the positive photoresist composition within the above range, it is made possible to obtain a positive photoresist composition which has high heat resistance, high resolution and DOF characteristics and also has good sensitivity.

When Mw of the solid content of the photoresist composition is less than the above range, heat resistance, resolution and DOF characteristics become insufficient. On the other hand, when Mw is more than the above range, the sensitivity drastically deteriorates and thus the coatability of the photoresist composition may be impaired.

The amount of the organic solvent is appropriately adjusted so that a uniform positive photoresist composition can be obtained when the components (A) to (C) and, if necessary, other components are dissolved therein. The organic solvent is used so that the solid content is preferably within a range from 10 to 50% by weight, and preferably from 20 to 45% by weight. The solid content of the positive photoresist composition corresponds to the total amount of the components (A) to (C) and, if necessary, other components.

The method of carrying out the step of adjusting Mw of the positive photoresist composition within a preferred range includes, for example, (1) a method of previously adjusting Mw of the component (A) by subjecting the component (A) to a fractionation operation before mixing so as to adjust Mn after mixing all components within the above range, and (2) a method of preparing a plurality of components (A) having different Mw(s) and adjusting Mw of the solid content by appropriately mixing them.

Among these methods, the method (2) is more preferable because of easy adjustment of the molecular weight of the resist and easy adjustment of the sensitivity.

In this embodiment, it is presumed that a crosslinked structure is formed as described above when a resist material is applied on a substrate and then heated, and thus a resist pattern having excellent heat resistance can be obtained and thickness loss is prevented.

Second Embodiment

Component (A)

In the second embodiment, a chemically amplified positive photoresist composition containing (a) a reaction product of the component (A) and the component (C), and the component (B) is used.

In the chemically amplified positive photoresist composition of this embodiment, similar to the first embodiment, it is presumed that a resist pattern having high heat resistance can be obtained by the action of the crosslinked structure.

In this embodiment, the component (A) is used without any limitation as long as it is an alkali soluble resin which is used in the photoresist composition, and it is preferred to have a hydroxyl group (preferably a phenolic hydroxyl group) in view of the reactivity with the component (C).

As the component (A), those listed in the above first embodiment can be preferably used.

Component (A)

The component (A) is a reaction product obtained by reacting the component (A) with the component (C) and has such characteristics that the solubility in an aqueous alkali solution increases by the action of the acid component.

The reaction between the component (A) and the component (C) usually gives a reaction product comprising a constituent unit wherein a vinyl group at one end of the component (C) is bonded with a phenolic hydroxyl group in the side chain of the component (A).

Specific examples of the constituent unit include a constituent unit represented by the following general formula (1A) and a constituent unit represented by the following general formula (2A).

The reaction between the component (A) and the component (C) gives a reaction product comprising the moiety wherein vinyl groups at both ends of the component (C) are respectively bonded with two phenolic hydroxyl groups in the side chain in the component (A). Specific examples of the constituent unit include a constituent unit represented by the following general formula (1B) and a constituent unit represented by the following general formula (2B).

It is presumed that, when using a novolak resin as the component (A), a constituent unit represented by the following general formula (1A) is formed and, in certain cases, an intermolecular crosslinked moiety represented by the following general formula (1B) is formed.

It is presumed that, when using a hydroxystyrenic resin as the component (A), a constituent unit represented by the following general formula (2A) is formed and, in certain cases, an intermolecular crosslinked moiety represented by the following general formula (2B) is formed.

That is, a component (A) comprising a constituent unit wherein only one end of the component (C) is bonded (for example, a constituent unit of the general formula (1A) or (2A)) is obtained. There may also be obtained a component (A) comprising a molecular crosslinked moiety wherein both ends are bonded (for example, a molecular crosslinked moiety the general formula (1B) or (2B)), in addition to the constituent unit wherein only one end is bonded.

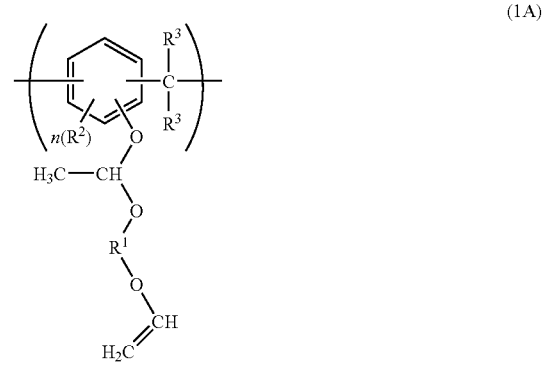

(1A)

wherein $R^1$ is as defined above, $R^2$ and $R^3$ each independently represents a hydrogen atom, an alkyl group having 1 to 3 carbon atoms or an aryl group, and n represents an integer of 1 to 3

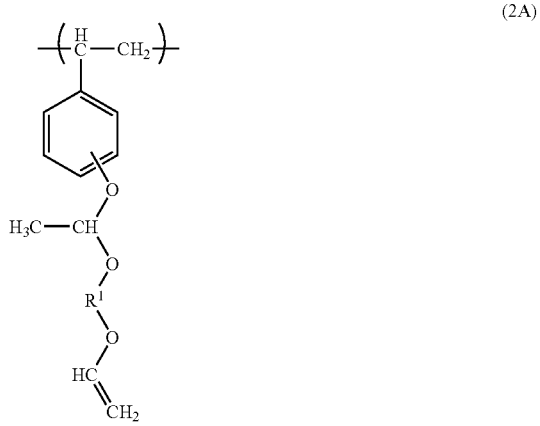

(2A)

wherein $R^1$ is as defined above

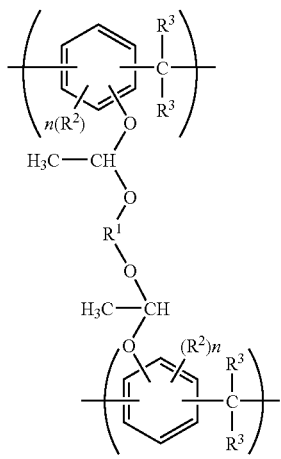

(1B)

wherein R¹, R² and R³ are as defined above

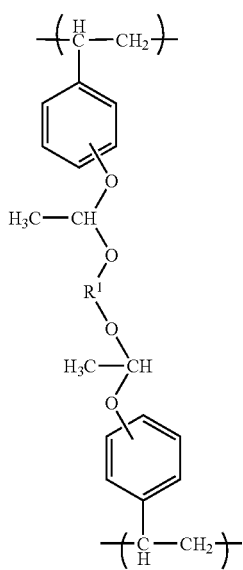

(2B)

wherein R¹ is as defined above

R² and R³ are groups derived from phenols, aldehydes and ketones explained in the description with regard to the novolak resin.

The component (A) in the present invention can be obtained by reacting the component (A) with the component (C) in the substantial absence of an acid catalyst when a novolak resin is selected as the component (A), or in the presence of the acid catalyst when a hydroxystyrenic resin is selected as the component (A).

When the component (C) is previously bonded with a hydroxyl group in the side chain of the alkali soluble resin (A), a change in quality of a resist coating solution (composition) over time is suppressed and thus a resist material with less change in sensitivity over time is obtained. When the resist material is applied on a substrate and then heated, a phenolic hydroxyl group in the side chain of the component (A) may be reacted with a terminal vinyl group of the constituent unit (1A) or (2A) to form a crosslinked structure. Consequently, it is presumed that the resist film becomes slightly soluble in an aqueous alkali solution such as alkali developer used to form a resist pattern.

It is presumed that, when the component (A) having the crosslinked structure is reacted with an acid generated from the component (B) under exposure, the crosslinked structure is cleaved and the solubility of the component (A) in the aqueous alkali solution increases.

When a novolak resin is selected as the component (A), since the reaction between the component (A) and the component (C) proceeds even when using no acid catalyst, the use of the acid catalyst is not essential and the presence of the acid component in the reaction system is not preferable in view of the storage stability after preparation of the resist. When a hydroxystyrenic resin is selected as the component (A), since the concentration of the acid component must be strictly controlled in the case of reacting the component (A) with the component (C), it is not preferred that the component (A) contain an acid component as impurities. Therefore, it is preferred to strictly perform the operation of removing the acid component contained in the component (A) before reacting with the component (C). The acid component is an acid catalyst used to synthesize a novolak resin, or an organic acid such as free acid which exists in the reaction solvent, and can be analyzed by gas chromatography.

The method of removing the acid component includes known methods, for example, use of an ion-exchange resin, washing with pure water, neutralization with an alkali or the like.

The concentration of the acid component in the component (A) before reacting with the component (C) is preferably adjusted to 0.1 ppm or less, and particularly preferably 0.01 ppm or less.

In view of the heat resistance, the weight average molecular weight of the component (A) obtained by reacting the component (A) with the component (C) is preferably from 10000 to 70000, and particularly preferably from 20000 to 50000, when a novolak resin is selected as the component (A), or it is preferably from 30000 to 150000, and particularly preferably from 40000 to 100000, when a hydroxystyrenic resin is selected as the component (A).

The component (C) is preferably used in the proportion within a range from 1 to 15% by weight, and more preferably from 4 to 8% by weight, based on the component (A) when a novolak resin is selected as the component (A). When the proportion is less than 1% by weight, thickness loss of the unexposed area of the resist pattern increases and thus contrast of the resist pattern tends to deteriorate. On the other hand, when the proportion is more than 15% by weight, the solubility in a developer (aqueous alkali solution) tends to drastically deteriorate, and thus causing problems such as poor sensitivity and failure in resolution.

When a hydroxystyrenic resin is selected as the component (A), the component (C) is preferably used in the proportion within a range from 1 to 15% by weight, and more preferably from 5 to 10% by weight, based on the component (A).

Component (B)

The component (B) in this embodiment is the same as in the first embodiment.

Component (D)

The component (D) in this embodiment may be the same as in the first embodiment. In this embodiment, the above compound (d1) is preferably used as the component (D).

Organic Solvent

The organic solvent in this embodiment may be the same as in the first embodiment.

These organic solvents can be used alone or in combination.

The organic solvent is preferably used in the proportion within a range of 10 to 50% by weight, and preferably from 20 to 45% by weight, in terms of the concentration of the solid content in view of the coatability.

In this embodiment, the same storage stabilizer as in the first embodiment can be used.

The photoresist composition of this embodiment can contain the same other components as in the first embodiment as long as the object of the present invention is not adversely affected.

Method for Preparation of Positive Photoresist Composition

The photoresist composition of this embodiment can be prepared in the same manner as in the first embodiment.

The positive photoresist composition of this embodiment is prepared so that Mw of the solid content in the photoresist composition is within a range from 3000 to 100000, and Mw is more preferably from 10000 to 80000.

In this embodiment, it is presumed that, when a resist material is applied on a substrate and then heated, a crosslinked structure is formed as described above. Therefore, a resist pattern having excellent heat resistance can be obtained and thus thickness loss is prevented.

According to the present invention, it is made possible to reconcile heat resistance and easy removability by using a chemically amplified positive photoresist composition having excellent heat resistance and performing a heat treatment step between a resist pattern forming step and a removing step.

EXAMPLES

The present invention will now be described in detail by way of examples. Examples 1 to 2 and Comparative Example 1 to 2 (Preparation of chemically amplified positive photoresist composition, Formation of resist pattern)

The following resist composition was prepared.

(Preparation of Photoresist Composition 1)
Component (A) [a1]: 100 parts by weight
 a1: polyhydroxystyrenic resin, styrene constituent unit/ hydroxystyrene constituent unit=15/85, Mw: 5000
Component (B) [compound of the formula (VII)]: 3 parts by weight
Component (C) [cyclohexanedimethanol divinyl ether]: 7 parts by weight
Component (D) [triethylamine]: 0.2 parts by weight The above respective components were dissolved in PGMEA and 500 ppm of XR-104 (trade name, manufactured by DAINIPPON INK AND CHEMICALS, INCORPORATED) as a surfactant was added to prepare a solution having a concentration of 35% by weight, and then the resulting solution was filtered using a membrane filter having a pore diameter of 0.2 µm to give a photoresist composition 1. The resulting photoresist composition 1 had an Mw of 4500.

(Preparation of Photoresist Composition 2)
Component (A) [a2]: 100 parts by weight
 a2: In a methyl isobutyl ketone (MIBK) solvent, the above component (a1) (Mw: 5000) was dissolved with stirring so that the resulting solution has a concentration of 30% by weight and, after adjusting the inner temperature within a range from 100 to 110° C., cyclohexanedimethanol divinyl ether was added dropwise in the amount corresponding to 8 parts by weight based on 100 parts by weight of the solid content of the resin. After reacting for 24 hours, the reaction solution was stirred at room temperature for 12 or more hours and MIBK as the solvent was replaced by 2-heptanone.

The resulting component (a2) had Mw of 55000.
Component (B) [compound of the formula (VII)]:3 parts by weight
Component (D) [triethylamine]: 0.2 parts by weight The above respective components were dissolved in PGMEA and 500 ppm of XR-104 (trade name, manufactured by DAINIPPON INK AND CHEMICALS, INCORPORATED) as a surfactant was added to prepare a solution having a concentration of 35% by weight, and then the resulting solution was filtered using a membrane filter having a pore diameter of 0.2 µm to give a photoresist composition 2. The resulting photoresist composition 2 had an Mw of 50000.

Each of coating solutions (compositions) prepared from the compositions 1 and 2 was applied on a silicon wafer and then prebaked at 140° C. for 90 seconds to form a 2.7 µm thick resist film.

Using an i-ray exposure apparatus (trade name: "NSR-2005i10D" manufactured by Nikon Corporation), selective exposure was performed, followed by a PEB treatment at 140° C. for 90 seconds, a development treatment with an aqueous 2.38 wt % TMAH solution for 60 seconds, a rinsing treatment with pure water for 30 seconds and a drying step to form a resist pattern of 0.8 µm L&S (line-and-space).

Removability Test

A silicon wafer (silicon substrate) on which the resist pattern is formed was placed on a hot plate set at 200° C. and then heat-treated for 300 seconds.

Then, the substrate was dipped in a remover (described in the following Table 1) tank set at 25° C. for 120 seconds.

After taking out the substrate, a removal state of the resist pattern on the substrate surface was visually observed. Samples where the resist pattern was completely removed and any resist pattern was not observed on the substrate were rated "A", while samples where the resist pattern was not completely removed and some residual resist pattern was observed on the substrate were rated "B". The results are shown in Table 1 below (Examples 1 and 2).

The substrate, which was not subjected to the above heat treatment, was also dipped in the same manner as described above and a removal state on the substrate was evaluated in the same manner as described above. The results are shown in Table 1 below Comparative Examples 1 and 2

(Heat Resistance Test)

A resist pattern (thickness: 1.26 µm, 100 µm L&S) was formed and subjected to a heat treatment at 160° C. for 300 seconds, and then cross-sectional shape was visually observed.

Samples where deformation of the resist pattern was scarcely observed were rated "A", while samples where shrink occurred were rated "B".

Comparative Examples 3 to 5

The following resist compositions were subjected to the same removability test and heat resistance test.

The results are also shown in Table 1.

Comparative composition 1: i-ray positive photoresist (not based on CA)

Trade name: THMR-iP5800 (manufactured by Tokyo Ohka Kogyo Co., Ltd.)

Comparative composition 2: positive photoresist for KrF (based on CA)

Trade name: TDUR-P015 (manufactured by Tokyo Ohka Kogyo Co., Ltd.)

Comparative composition 3: i-ray negative photoresist (based on CA)

Trade name: TSMR-iN008 (manufactured by Tokyo Ohka Kogyo Co., Ltd.)

TABLE 1

| | Composition | Heat treatment | Heat resistance | PGME/ PGME A = 7/3 | γ-butyrolactone | MEK | Butyl acetate | DMSO/ monoethanolamine = 3/7 |
|---|---|---|---|---|---|---|---|---|
| Example 1 | Composition 1 | Performed | A | A | A | A | A | A |
| Example 2 | Composition 2 | Performed | A | A | A | A | A | A |
| Comparative Example 1 | Composition 1 | None | A | B | B | B | B | B |
| Comparative Example 2 | Composition 2 | None | A | B | B | B | B | B |
| Comparative Example 3 | Comparative composition 1 | None | B | A | A | A | A | A |
| Comparative Example 4 | Comparative composition 2 | None | B | A | A | A | A | A |
| Comparative Example 5 | Comparative composition 3 | None | A | B | B | B | B | B |

As is apparent from the results of the above examples and comparative examples, a specific resist composition used in the present invention has the heat resistance which is almost the same as that of a resist pattern formed by using a negative photoresist, and that the removability with a conventional remover is improved by subjecting to a heat treatment step after forming the resist pattern.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description but is only limited by the scope of the appended claims.

What is claimed is:

1. A method for removing a resist pattern, which comprises a resist pattern forming step of forming a resist pattern on a substrate using a chemically amplified positive resist composition and a removing step of removing the resist pattern from the substrate using a solvent, a composition prepared by dissolving (A) an alkali soluble resin having a hydroxyl group in the side chain, (B) a photo acid generator and (C) a compound represented by the following general formula (I):

$$H_2C=CH-O-R^1-O-CH=CH_2 \quad (I)$$

wherein $R^1$ represents either an alkylene group having 1 to 10 carbon atoms which may have a substituent, or a group represented by the following general formula (II):

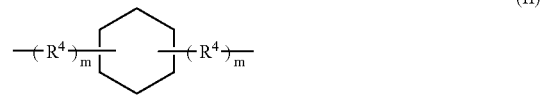

(wherein $R^4$ represents an alkylene group having 1 to 10 carbon atoms which may have a substituent, and m represents 0 or 1) in an organic solvent being used as the chemically amplified positive resist composition, said method further comprising a heat treatment step of heat-treating the substrate on which the resist pattern is formed at a temperature of 150 to 400° C. between the resist pattern forming step and the removing step.

2. A method for removing a resist pattern, which comprises a resist pattern forming step of forming a resist pattern on a substrate using a chemically amplified positive resist composition and a removing step of removing the resist pattern from the substrate using a solvent, a composition prepared by dissolving (a) a reaction product of (A) an alkali soluble resin having a hydroxyl group in the side chain and (C) a compound represented by the following general formula (I):

$$H_2C=CH-O-R^1-O-CH=CH_2 \quad (I)$$

wherein $R^1$ represents either an alkylene group having 1 to 10 carbon atoms which may have a substituent, or a group represented by the following general formula (II):

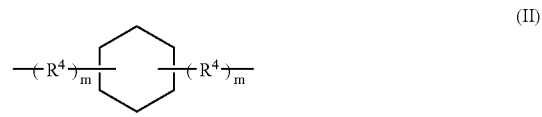

(wherein $R^4$ represents an alkylene group having 1 to 10 carbon atoms which may have a substituent, and m represents 0 or 1), and (B) a photo acid generator in an organic solvent being used as the chemically amplified positive resist composition, said method further comprising a heat treatment step of heat-treating the substrate on which the resist pattern is formed at a temperature of 150 to 400° C. between the resist pattern forming step and the removing step.

3. The removing method according to claim 1, wherein a hydroxystyrenic resin having a hydroxystyrenic constituent unit is used as the component (A).

4. The removing method according to claim 1, wherein the time of the heat treatment is from 60 to 600 seconds.

5. The removing method according to claim 1, wherein, in the removing step, at least one selected from PGME (propylene glycol monomethyl ether), PGMEA (propylene glycol monomethyl ether acetate), γ-butyrolactone, methyl ethyl ketone, butyl acetate, DMSO (dimethyl sulfoxide) and monoethanolamine is used as the solvent.

6. The removing method according to claim 2, wherein a hydroxystyrenic resin having a hydroxystyrenic constituent unit is used as the component (A).

7. The removing method according to claim 2, wherein the time of the heat treatment is from 60 to 600 seconds.

8. The removing method according to claim 2, wherein, in the removing step, at least one selected from PGME (propylene glycol monomethyl ether), PGMEA (propylene glycol monomethyl ether acetate), γ-butyrolactone, methyl ethyl ketone, butyl acetate, DMSO (dimethyl sulfoxide) and monoethanolamine is used as the solvent.

9. A method for removing a resist pattern comprising:
preparing a chemically amplified positive resist composition by dissolving (A) an alkali soluble resin having a hydroxyl group in the side chain, (B) a photo acid generator and (C) a compound represented by the following general formula (I):

$$H_2C{=}CH{-}O{-}R^1{-}O{-}CH{=}CH_2 \qquad (I)$$

wherein $R^1$ represents either an alkylene group having 1 to 10 carbon atoms optionally containing a substituent, or a group represented by the following general formula (II):

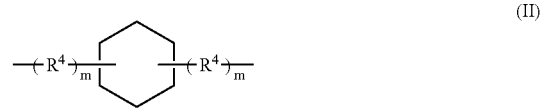

(II)

(wherein $R^4$ represents an alkylene group having 1 to 10 carbon atoms optionally containing a substituent, and m represents 0 or 1) in an organic solvent;

forming a resist pattern on a substrate using said chemically amplified positive resist composition;

heat-treating the substrate on which the resist pattern is formed at a temperature of 150 to 400° C.; and removing the resist pattern from the substrate using a solvent.

* * * * *